United States Patent [19]
Yonekawa

[11] Patent Number: 6,088,082
[45] Date of Patent: Jul. 11, 2000

[54] PROJECTION ALIGNER AND PROJECTION ALIGNING METHOD

[75] Inventor: Masami Yonekawa, Utsunomiya, Japan

[73] Assignee: Canon Kabushiki Kaisha, Tokyo, Japan

[21] Appl. No.: 09/006,050

[22] Filed: Jan. 12, 1998

[30] Foreign Application Priority Data

Jan. 14, 1997 [JP] Japan .................................... 9-016027

[51] Int. Cl.$^7$ ........................ G03B 27/42; G03B 27/54; G03B 27/72
[52] U.S. Cl. ................... 355/53; 355/67; 355/71
[58] Field of Search .......................... 355/53, 67, 68, 355/69, 71; 250/548

[56] References Cited

U.S. PATENT DOCUMENTS

| | | | |
|---|---|---|---|
| 4,875,076 | 10/1989 | Torigoe et al. | 355/53 |
| 5,184,176 | 2/1993 | Unno et al. | 355/53 |
| 5,661,546 | 8/1997 | Taniguchi | 355/53 |
| 5,801,815 | 9/1998 | Takahashi | 355/53 |

FOREIGN PATENT DOCUMENTS 4-192317  7/1992  Japan .

*Primary Examiner*—Safet Metjahic
*Assistant Examiner*—Peter Kim
*Attorney, Agent, or Firm*—Fitzpatrick, Cella, Harper & Scinto

[57] ABSTRACT

A projection aligner and a projection aligning method for projecting light onto a circuit pattern on a reticle and for aligning and projecting the circuit pattern onto a substrate via a projection lens assembly. A reticle reference data curve is generated, which indicates a relationship between exposure time of the reticle and a variation in the exposure magnification of the reticle, which curve is obtained when exposure is performed under a reference exposure condition established using a parameter governing the exposure magnification of the reticle. A projection lens reference data curve is generated, indicating a relationship between exposure time of the projection lens assembly and a variation in the exposure magnification of the lens assembly, which curve is obtained when exposure is performed under a reference exposure condition established using a parameter governing the exposure magnification of the projection lens assembly. Information is stored, related to the reticle reference data curve and related to the projection lens assembly data curve. Exposure magnification is corrected by utilizing the stored information.

16 Claims, 10 Drawing Sheets

PROJECTION ALIGNER AND PROJECTION ALIGNING METHOD

BACKGROUND OF THE INVENTION

1. Field of the Invention

The present invention relates to an aligner, commonly known as a "stepper", which performs stepping and repeating in sequence to align and project an electronic circuit pattern on the surface of a reticle onto the surface of a wafer via a projection optical system, and an aligner, commonly known as a "scanner", which performs stepping and scanning, in sequence, to execute the alignment and the projection onto the surface of a wafer in the same manner in the manufacturing process of semiconductor devices such as ICs and LSIs. More particularly, the present invention relates to a projection aligner and a projection aligning method for manufacturing semiconductors, the projection aligner and the projection aligning method being provided with a function and a step, respectively, for achieving integral control of various influences caused by the heat of exposure light generated during a projecting and aligning process, and for making necessary corrections, such influences including the thermal deformation of a reticle, and the thermal deformation and/or a change in the refractive index of each lens element.

2. Description of The Related Art

With the recent increasing trend toward microscale patterns of ICs, LSIs, and other semiconductor integrated circuits, there has been a strong demand for further improvement in the resolution, overlapping accuracy, and throughput of projection aligners. Today, more LSI manufacturers are employing high-resolution steppers for critical layers while employing steppers that have a lower resolution, but have a wider field angle and higher throughput for noncritical layers, so as to improve throughput in their mass-production lines. In order to successfully cope with the mix and match processes required to handle such different types of steppers, it is especially important to improve the overlapping accuracy. Improving the overlapping accuracy requires that the changes in the magnification, distortion, etc., in a shot be minimized, in addition to the need for restraining the shift of a shot array in a wafer, magnification, and rotational components in a wafer. One of the factors responsible for the foregoing changes in the shot has conventionally been considered to be due to a phenomenon wherein a projection lens assembly absorbs exposure light and the respective lens elements thereof incur thermal deformation, causing the refractive index therein to be changed.

Recently, however, it has been revealed that the changes in the magnification, distortion, etc., in a shot cannot be explained simply by the absorption of exposure light by the projection lens assembly.

The problems caused by the heat from exposure light are roughly divided into the following three types:

First, as previously mentioned, when the projection lens assembly absorbs exposure light, it incurs thermal deformation and a change in the refractive index thereof, resulting in a change in the image forming performance thereof. Conventional corrective measures for coping with this problem include one wherein a sealed space is provided between particular lens elements to control and adjust the pressure in the space, or a particular lens element is moved along an optical axis to make corrections.

Second, a reticle absorbs exposure light and incurs thermal deformation, generating a magnification component. This problem has become noticeable as the technology in the industry has advanced, which is represented by exposure lamps having higher luminance, or three-layer Cr surfaces for preventing the flare of an optical system, in order to respond to the recent demand for higher throughput. To solve this problem, there has been a method in which the rise in temperature is prevented by subjecting a reticle to forced air cooling, or a method disclosed in Japanese Unexamined Patent Publication No. 4-192317 in which the thermal deformation of the reticle is determined by calculation or actual measurement and the amount of correction to be made by a lens magnification correcting means is computed according to the obtained thermal deformation, so as to make a correction.

The third problem is that a wafer absorbs exposure light applied thereto and thermally expands. This problem is conspicuous especially with a high-throughput type stepper supplying a high level of energy to the wafer per unit time. It is not easy to devise an active corrective method to solve this problem because the magnification actually generated on the wafer is strongly influenced by an adjacent shot and the generated magnification component varies depending on the position of the shot. For this reason, a method has been used whereby the heat conduction between a wafer and a chuck is improved so that the heat absorbed at a shot position on the wafer is quickly diffused to the wafer chuck, or a static measure has been proposed wherein the chuck is provided with a water-cooling device.

The foregoing conventional techniques, however, have the following shortcomings:

The errors including the magnification and the distortion component in a shot attributable to the heat of exposure light are considered to be caused by the linear sum of the aforesaid factors, namely, the reticle factor, the projection lens factor, and the wafer factor. The corrective measures, however, have been made independently for each of the three factors. In other words, no integrated corrective function has been devised for an entire stepper system. More specifically, whereas the magnification and distortion that take place on an exposure image surface involve all three of the foregoing factors, inseparably, the magnification that has occurred is regarded as being wholly due to the absorption of exposure light by a projection lens and a correction is made accordingly. Hence, a corrective operation leads to an over-correction or an under-correction depending on the individual actual processing conditions, thus preventing an effective overall corrective operation from being accomplished.

SUMMARY OF THE INVENTION

Accordingly, it is an object of the present invention to provide a projection aligner and a projection aligning method which overcome the foregoing shortcomings of the prior art, which enable detailed magnification or distortion corrective measures to be achieved for a variety of processes by determining a proper magnification correcting timing of the entire system, and which permit highly accurate overlapping, or mixing and matching between different types of steppers to be accomplished easily.

To this end, according to the present invention, there are provided a projection aligner and a projection aligning method which project light onto a circuit pattern on a reticle for aligning and projecting the circuit pattern onto a substrate via a projection lens assembly. A reticle reference data curve is generated, indicating a relationship between exposure time of the reticle and a variation in the exposure magnification of the reticle, which curve is obtained when exposure is performed under a reference exposure condition established using a parameter governing the exposure magnification of the reticle. A projection lens reference data curve also is generated, indicating a relationship between exposure time of the projection lens assembly and a variation in the exposure magnification of the lens assembly, which curve is obtained when exposure is performed under a reference exposure condition established using a parameter governing the exposure magnification of the projection lens assembly. Information is stored related to the reticle reference data curve and information is stored related to the projection lens assembly data curve. Exposure magnification is corrected by utilizing the stored information. Also, the exposure magnification may be corrected at a timing for each substrate or for each projection shot.

In another aspect, the information related to the reticle reference data curve and the information related to the projection lens assembly data curve may be combined to obtain combined information corresponding to a combined data curve indicating a variation in overall exposure magnification with respect to the exposure time, the curve being based on the parameter governing the exposure magnification of the reticle and the parameter governing the exposure magnification of the projection lens assembly, at actual exposure. In this case, the overall exposure magnification may be corrected on the basis of the combined information. Also, the overall exposure magnification may be corrected by determining a correction amount of the exposure magnification and a correction timing on the basis of the combined data curve, showing the variation in the overall exposure magnification with respect to the exposure time, and on the basis of a predetermined tolerance in the variation in the exposure magnification, which can be determined from an overlapping accuracy and a minimum linewidth for the circuit pattern on the reticle. In this case, the magnification and distortion of the projection lens assembly may be corrected according to the correction amount of the magnification at the correction timing.

In another aspect, when the reticle has been replaced with a new one in performing projection alignment, if a process exposure interval, which is a time interval between the end of one exposure process of the reticle and the start of exposure of the new reticle is shorter than the exposure time required for a steady state to be reached in the reference data curve indicating a relationship between the projection lens assembly exposure time and the variation in the projection lens assembly exposure magnification, then the projection lens assembly magnification is obtained at the start of the exposure of the new reticle from the data on that curve and from the process exposure interval, and by taking the obtained projection lens assembly magnification into account, magnification correction data may be obtained on that curve for the new reticle. In this respect, a data curve indicating a variation in the projection lens assembly exposure magnification with the exposure time and a data curve indicating a variation in the reticle exposure magnification with the exposure time of the new reticle may be combined, so as to obtain a new data curve indicating a variation in the overall exposure magnification with respect to the exposure time for the new reticle.

Important features of the present invention will now be explained in more detail.

The present invention described above focuses on two factors, namely, the reticle and the projection lens, out of the aforesaid three factors responsible for the variation, in order to actively correct the components of the variation in the magnification and distortion taking place in an exposure shot.

First, the magnification occurring from exposure is broken down into a magnification variation curve $f_R$ based on the reticle factor and a magnification variation curve $f_L$ based on the projection lens factor by carrying out experiments, simulations, etc. The variation in the exposure magnification is caused by the mechanism of nonsteady heat conduction; therefore, the two curves, namely, the magnification variation curve based on the reticle factor $f_R$ and the magnification variation curve based on the projection lens factor $f_L$, indicate the proportion of an error function erf ($\xi$), which is the solution of a nonsteady heat conduction equation. Normally, the variation in the shot magnification observed is defined as a linear combination of the functions $f_R$ and $f_L$ thus obtained and other factors, err, including the wafer factor:

$$\beta = a \cdot f_R(\tau) + b \cdot f_L(\tau) + err$$

The present invention involves the two factors, namely, the reticle factor and the projection lens factor, in the formula given above; hence, the magnification expressed by the formula given below will be corrected:

$$\mu_{RL} = a \cdot f_R(\tau) + b \cdot f_L(\tau)$$

where functions a and b serve as the functions of parameters x1, x2, and so on, and y1, y2, and so on of each factor. For example, the parameters of the reticle factor, the existence ratio, the reticle surface illuminance, etc., correspond to x1, x2, and so on. As the exposure condition or the reticle condition changes for each process, the value of the coefficient a or b changes accordingly, meaning that a particular factor exerts marked or less influence on the exposure magnification $\beta_{RL}$. In making an actual correction, the correction of magnification and the correction timing are computed from the tolerance of the variation in magnification determined by the desired linewidth and alignment accuracy according to the determined exposure magnification $\beta_{RL}$. Then, an open-loop correction is made by using a known magnification correcting means such as a lens driving means to cancel the foregoing variation in magnification.

The use of such a means permits a detailed estimate of the variation in the magnification and distortion in a shot for each exposure process and for each parameter. This enables more accurate corrections to be made, and accordingly permits highly precise overlapping and mixing and matching between different types of steppers to be realized easily.

DESCRIPTION OF THE PREFERRED EMBODIMENTS

A first embodiment of the present invention will now be explained in conjunction with the accompanying drawings.

Before explaining the essential portions of the first embodiment, a brief description will be given of the configuration of a projection aligner, i.e., a stepper, to which the present invention will be applied, with reference to FIG. 3.

Figure 3:
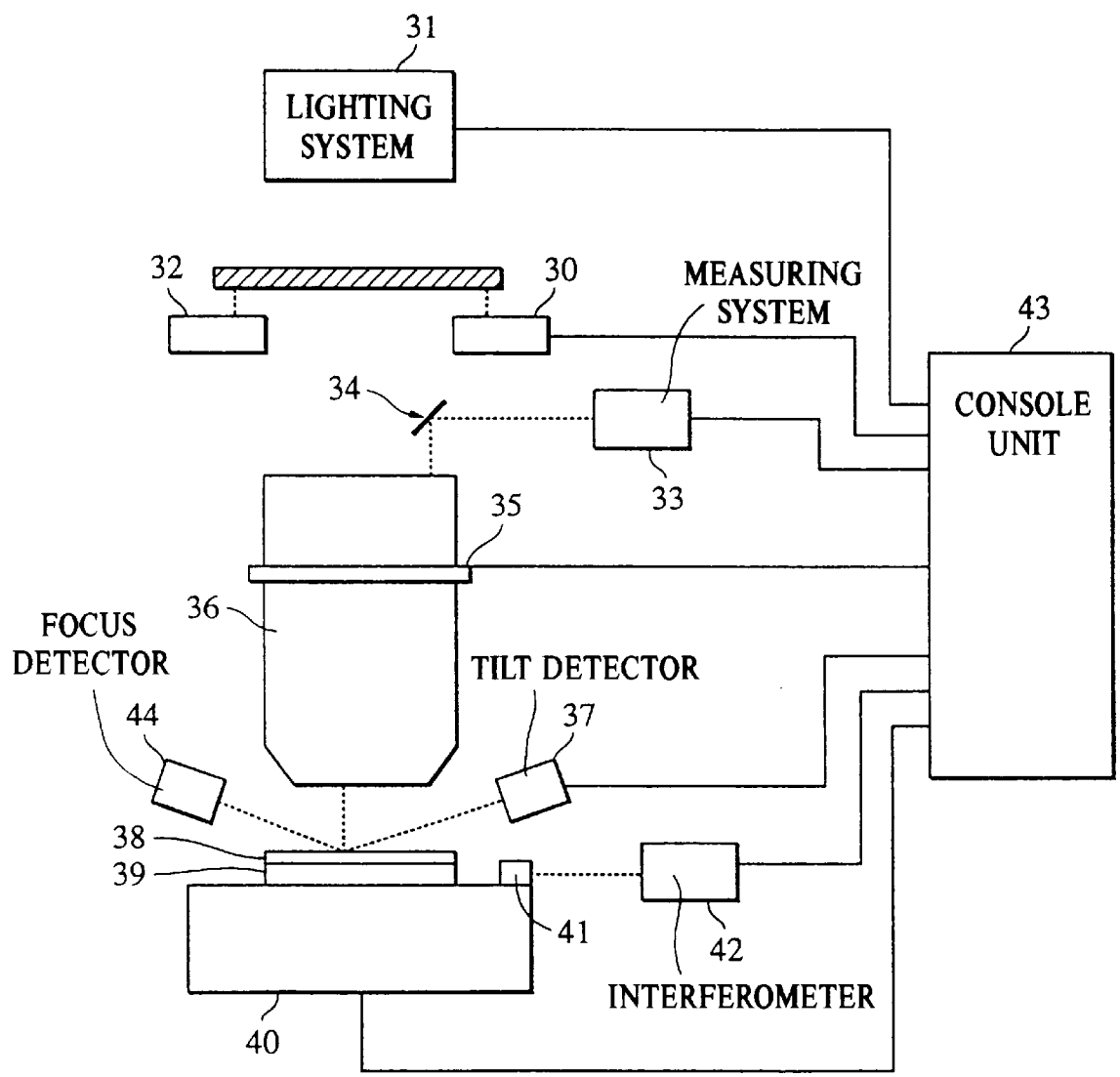
FIG. 3 is a schematic diagram of an apparatus to which the present invention is applied.

The stepper system shown in FIG. 3 has a lighting system 31, a reticle 30 on which a circuit pattern has been formed, and a substrate 32 which is mounted on a reticle stage, not shown. The reticle 30 is positioned by using the substrate 32 as a reference. Measurements for the positioning are stored in a console unit 43, which controls the entire stepper system.

The stepper system further includes a projection lens assembly 36 through which the pattern image on the reticle 30 is projected onto a wafer 38, a well-known lens driving unit 35 for correcting a change in the image forming performance of the projection lens assembly 36 caused by atmospheric pressure and/or exposure, a mirror 34 for changing the direction of a probe beam used for performing wafer alignment measurement by the through-the-lens (TTL) method in an off-axis mode, and a measuring system 33.

The focus position of the projection lens assembly 36 and the tilt of the wafer 38 are respectively detected by a well-known focus detector 44 and a well-known wafer tilt detector 37 by applying a light beam to the surface of the wafer 38 and photoelectrically detecting the reflected beam.

An interferometer mirror 41 and an interferometer 42 constantly monitor the positions of a wafer chuck 39 which vacuum-chucks the wafer 38 and a wafer stage 40 which can be roughly and finely moved in the directions of x, y, and θ. The console unit 43 controls the entire stepper system including the foregoing major components. This completes the summary of the configuration of the projection aligner to which the present invention will be applied.

The principles of the present invention will now be explained.

As mentioned above, an important point in the present invention is to divide the variation in the magnification occurring in a shot into a reticle factor and a lens factor, which can be actively corrected, and to obtain exposure magnification curves of the respective factors.

First, the curve of the exposure magnification variation of the reticle 30 will be discussed. The reticle 30 employs quartz glass as the base material thereof and has a low linear expansion coefficient, 0.5 ppm. Hence, the thermal expansion of the reticle 30 may be almost negligible when the existence ratio, i.e., the area ratio, of a Cr pattern is low. If the existence ratio, i.e., the area ratio, of the Cr pattern is high, then the pattern absorbs more exposure energy and the temperature of the quartz glass rises due to the heat conduction process, causing thermal expansion.

Figure 4:
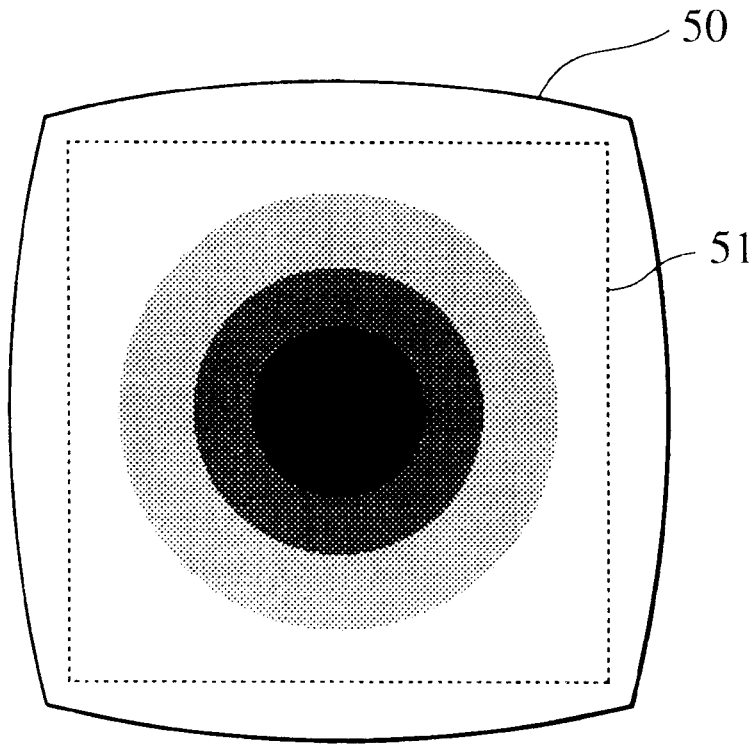
FIG. 4 is a schematic top view of a reticle which has been thermally deformed.

FIG. 4 shows the state of a reticle which has been subjected to the exposure for awhile. In FIG. 4, reference numeral 51 denotes the contour of the reticle before it is thermally deformed; and reference numeral 50 denotes the contour of the reticle which has been thermally deformed. If the existence ratio of the circuit pattern is nearly uniform on the surface of the reticle, then the temperature distribution caused by the absorption of the exposure light is almost concentric, as illustrated, and the consequent thermal deformation is vertically and horizontally symmetrical. The temperature rise of the reticle 30 follows a regular, nonsteady heat conduction pattern, drawing a curve proportional to the error function erf ($\xi$) which is the solution to the equation. Accordingly, the amount of the thermal deformation at each point of the reticle 30 is also proportional to the error function erf ($\xi$); and, as a result, a variation curve PR of the reticle exposure magnification is obtained, as shown in FIG. 6.

Figure 6:
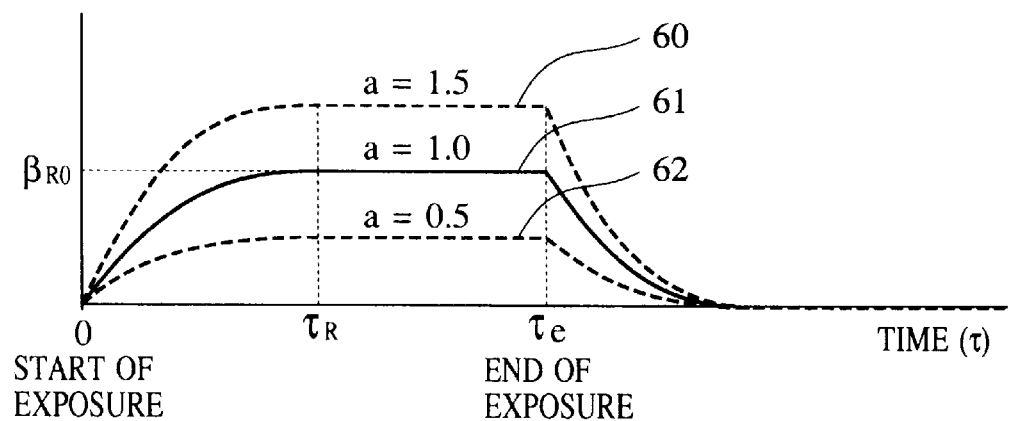
FIG. 6 is a graph showing the curve of a reticle exposure magnification.

In FIG. 6, the axis of the ordinate defines the direction in which the projection pattern shrinks on the exposure image surface, as a negative magnification change. In the thermal deformation of the reticle, the variation in the magnification takes place so that a circuit pattern is made larger than specified; hence, the variation curve $\beta_R$ is in the positive direction. When the exposure is started at $\tau=0$, the reticle exposure magnification reaches a steady state at a certain time, $\tau=\tau_R$; when the exposure is stopped at $\tau=\tau_e$, the reticle is cooled, following a curve which is reversed from the one observed in the zone defined by $0<\tau<\tau_R$, and the same magnification is maintained until the exposure is restarted. The time constant $\tau_R$ is a function of the temperature conductivity $\alpha(=k/\rho c$; k: heat conductivity; $\rho$: density; and c: specific heat) of the material; hence, $\tau_R$ remains unchanged even if the exposure condition is changed and the energy absorbed by the reticle 30 is accordingly increased or decreased.

In a similar manner, the projection lens assembly 36 shown in FIG. 3 will now be discussed.

Figure 5:
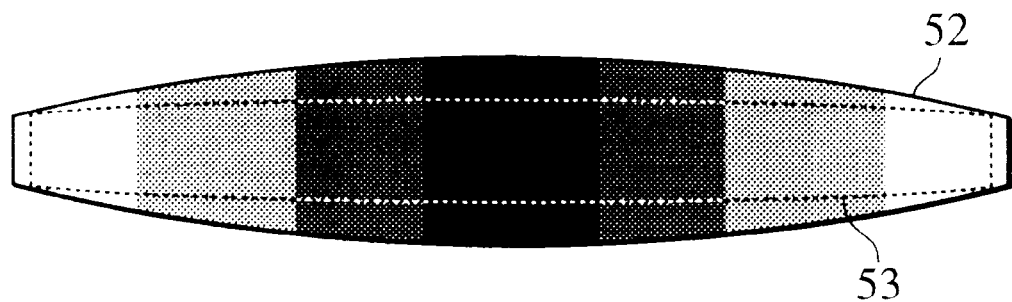
FIG. 5 is a schematic side view of a lens which has been thermally deformed.

FIG. 5 shows the section of a single lens element of the projection lens assembly 36, which has been subjected to the exposure for awhile. Reference numeral 53 denotes the contour of the lens before it is thermally deformed; and reference numeral 52 denotes the contour of the lens which has been thermally deformed. The temperature of the lens 52 rises concentrically around the optical axis, so that the lens deforms rotationally symmetrically. The variation in the magnification of the lens 36 is caused by two factors, namely, the change in the surface shape and the change in the refractive index; the mechanism thereof is also based on the unsteady heat conduction as in the case of the reticle 30. Hence, the variation curve $\beta_L$ of the lens exposure magnification will be that as shown in FIG. 7.

Figure 7:
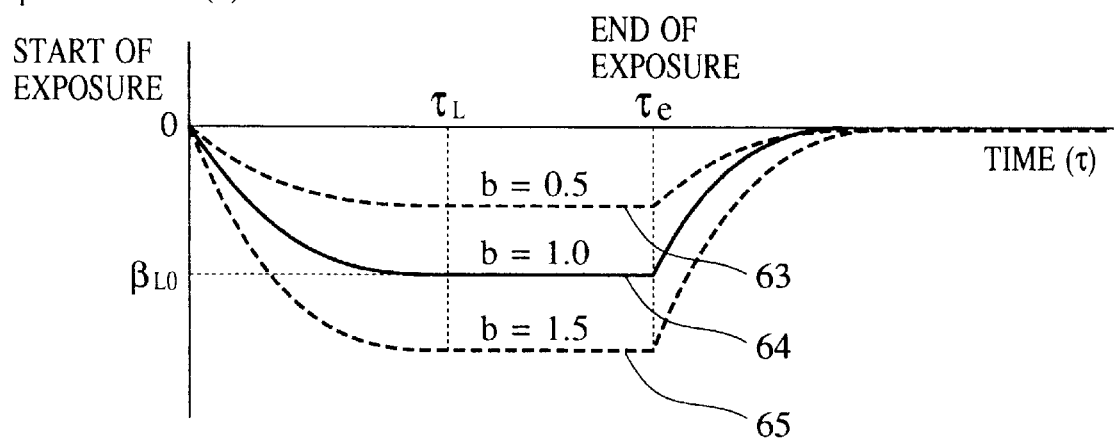
FIG. 7 is a graph showing the curve of a lens exposure magnification.

In FIG. 7, it is considered that the absorption of the exposure light by the projection lens assembly 36 causes the variation in the magnification in the direction in which the projection pattern shrinks on the exposure image surface. The time constant $\tau_L$ of the projection lens assembly 36 and the time constant $\tau_R$ of the reticle 30 have the relationship of $\tau_L \approx \tau_R$ because the temperature conductivity a of the material of the projection lens assembly 36 is nearly equal to that of the reticle 30.

Figure 8:
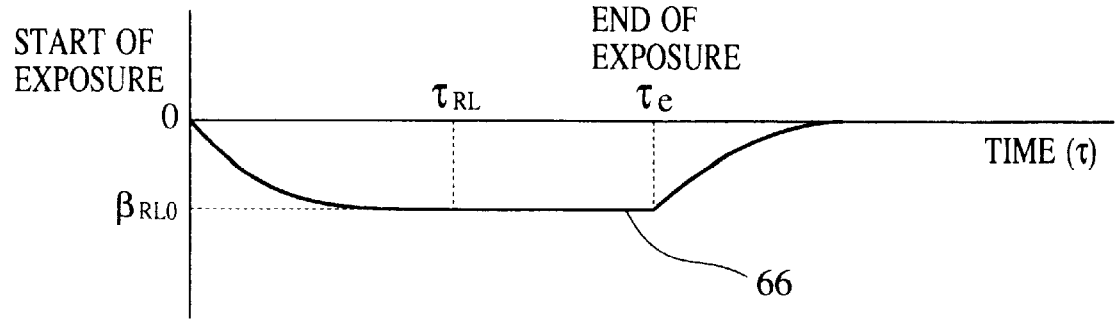
FIG. 8 is a graph showing the curve of an integrated exposure magnification.

The actual exposure magnification observed is a result of the linear sum of the exposure magnification $\beta_R$ of the reticle 30 and the exposure magnification $\beta_L$ of the projection lens assembly 36. The combined magnification variation curve denoted by $\beta_{RL}$ is shown in FIG. 8. Thus, in the case of a contact hole process wherein the aperture ratio of the Cr pattern of the reticle 30 is extremely small, the level of energy launched into the projection lens assembly 36 is low, although the level of energy absorbed by the reticle 30 is high, so that the reticle factor governs the exposure magnification. Conversely, in the case of an aluminum wiring process wherein the reticle opening ratio is large, the level of lighting energy launched into the projection lens assembly 36 is higher than that absorbed by the reticle 30, so that the lens factor governs the exposure magnification. This embodiment refers to a case wherein the integrated exposure magnification $\beta_{RL}$ varies in the negative direction, that is, the lens exposure magnification $\beta_L$ exerts a greater influence on the integrated exposure magnification $\beta_{RL}$ than does the reticle exposure magnification $\beta_R$. For this reason, the magnification variation curves $\beta_R$ and $\beta_L$ of the reticle 30 and the lens assembly 36, respectively, are determined in advance by carrying out experiments, simulations, etc., so that the magnification variation curves can be predicted merely by computing parameters even if the reticle condition, i.e., the exposure condition, is changed as the process is changed. In actual corrective action, a particular lens is driven in the direction of the optical axis by the lens driving means 35 provided on the projection lens assembly 36 to cancel the magnification curve $\beta_{RL}$ so as to correct the magnification.

The procedure for determining the exposure magnification curves, which are important in the invention, will now be explained.

Important for the procedure are the value at the moment the magnification reaches steady state and the time required for reaching the steady state value, namely, the time constant. Table 1 below shows the major parameters that are considered to govern the reticle exposure magnification.

TABLE 1

| | Parameter Name of Reticle Exposure Magnification | Name of Variable | Reference Value |
|---|---|---|---|
| 1 | Reticle Surface Illuminance | x1 | x1c |
| 2 | Existence Ratio of Cr Pattern | x2 | x2c |
| 3 | Exposure Duty | x3 | x3c |
| 4 | Exposure Area | x4 | x4c |
| 5 | Cr Pattern Absorption Ratio (2 layers/3 layers) | x5 | x5c |

Based on the parameters given above, absorbed energy $Q_R$ per unit time of the reticle 30 can be estimated under any processing condition by using the formula shown below:

$$Q_R = x1 \cdot x2 \cdot x3 \cdot x4 \cdot x5.$$

Thus, it can be easily seen that the absorbed energy $Q_R$ is proportional to the parameters and, therefore, the thermal deformation and the change in the magnification of the reticle 30 are also proportional to the parameters.

The following procedure is performed to actually determine the reticle exposure magnification reference curve $f_R$. In order to emphasize the reticle factor by excluding the factors other than the reticle factor, a test reticle having the Cr pattern existence ratio of, for example, approximately 90% is employed. Standard values are used for other parameters to provide the reference values x1c, x2c, and so on. Thus, the exposure operation is performed intermittently and a vernier pattern of the wafer 38, which has been actually baked, is measured and the magnification component is extracted. This will give a reticle exposure magnification curve $f_R$ denoted by reference numeral 61 in FIG. 6. In this case, the time required for the magnification to reach a constant value, i.e., the time constant, is denoted as $\tau_R$, and the constant magnification is denoted as $\beta_{R0}$.

Next, the actual reticle exposure magnification curve is obtained. First, from the foregoing reference parameters, the absorbed energy per unit time of the reticle 30 is computed using the formula shown below:

$$Q_{RC} = x1c \cdot x2c \cdot x3c \cdot x4c \cdot x5c.$$

Hence, under an arbitrary processing condition, the reticle exposure magnification $\beta_R$ can be expressed in terms of the following formula by introducing a reticle exposure coefficient a $(=Q_R/Q_{RC})$ and employing the foregoing obtained magnification curve $f_R$:

$$\beta_R = a \cdot f_R(\tau).$$

Thus, even if the parameters of the reticle factor change according to the process, the reticle exposure magnification curve $\beta_R$ can be predicted simply by calculating the coefficient a. In FIG. 6, reference numerals 60 and 62 denote curves $\beta_R$ observed when different parameters are used.

In a similar manner, the lens exposure magnification will now be discussed. Table 2 below shows the major parameters governing the lens exposure magnification.

TABLE 2

| | Parameter Name of Lens Exposure Magnification | Name of Variable | Reference Value |
|---|---|---|---|
| 1 | Reticle Surface Illuminance | y1 | y1c |
| 2 | Opening Ratio of Cr Pattern | y2 | y2c |
| 3 | Exposure Duty | y3 | y3c |
| 4 | Exposure Area | y4 | y4c |

From the parameters given above, incident energy $Q_L$ per unit time of the lens assembly 36 under an arbitrary processing condition can be estimated using the following formula:

$$Q_L = y1 \cdot y2 \cdot y3 \cdot y4.$$

Thus, it can be easily seen that the incident energy $Q_L$ is proportional to the parameters and, therefore, the exposure magnification of the lens assembly 36 is also proportional to the parameters.

The following procedure is taken to actually determine the lens exposure magnification reference curve $f_L$. In order to emphasize the lens factor by excluding the factors other than the projection lens factor, a test reticle having a Cr pattern transmittance of, for example, approximately 90% is employed, and a wafer chuck made of a material having a low coefficient of thermal expansion is used as the wafer chuck 39. Standard values are used for other parameters to provide the reference values y1c, y2c, and so on. Thus, the exposure operation is performed intermittently and the vernier pattern of the wafer 38, which has been actually baked, is measured and the magnification component is extracted. This will give a lens exposure magnification reference curve $f_L$ denoted by reference numeral 64 in FIG. 7. In this case, the time required for the magnification to reach a constant value, i.e., the time constant, is denoted as $\tau_L$, and the constant magnification is denoted as $\beta_{L0}$.

Next, the actual lens exposure magnification curve is obtained. First, from the foregoing reference parameters, the incident energy per unit time of the lens assembly 36 is computed using the formula shown below:

$$Q_{LC} \cdot y1c \cdot y2c \cdot y3c \cdot y4c.$$

Hence, under an arbitrary processing condition, the lens exposure magnification $\beta_L$ can be expressed in terms of the following formula by introducing a lens exposure coefficient b ($=Q_L/Q_{LC}$):

$$\beta_L = b \cdot f_L(\tau)$$

In this way, even if the parameters of the lens factor change according to the process, the lens exposure magnification curve $\beta_L$ can be predicted simply by calculating the coefficient b. In FIG. 7, reference numerals 63 and 65 denote curves $\beta_L$ observed when different parameters are used.

Thus, the exposure magnification has been broken down into the reticle factor and the projection lens factor to determine the variation curves $\beta_R$ and $\beta_L$. The integrated exposure magnification used for making an actual correction is represented by the sum of these exposure magnifications; that is, it is expressed by the formula given below:

$$\beta_{RL} = \beta_R + \beta_L = a \cdot f_R(\tau) + b \cdot f_L(\tau)$$

This is the integrated exposure magnification curve $\beta_{RL}$ which is essential for correcting the magnification at the time of actual exposure.

The exposure sequence including the operation for correcting the exposure magnification by the console 43 of this embodiment will now be explained in conjunction with FIG. 1 and FIG. 2.

Figure 1:
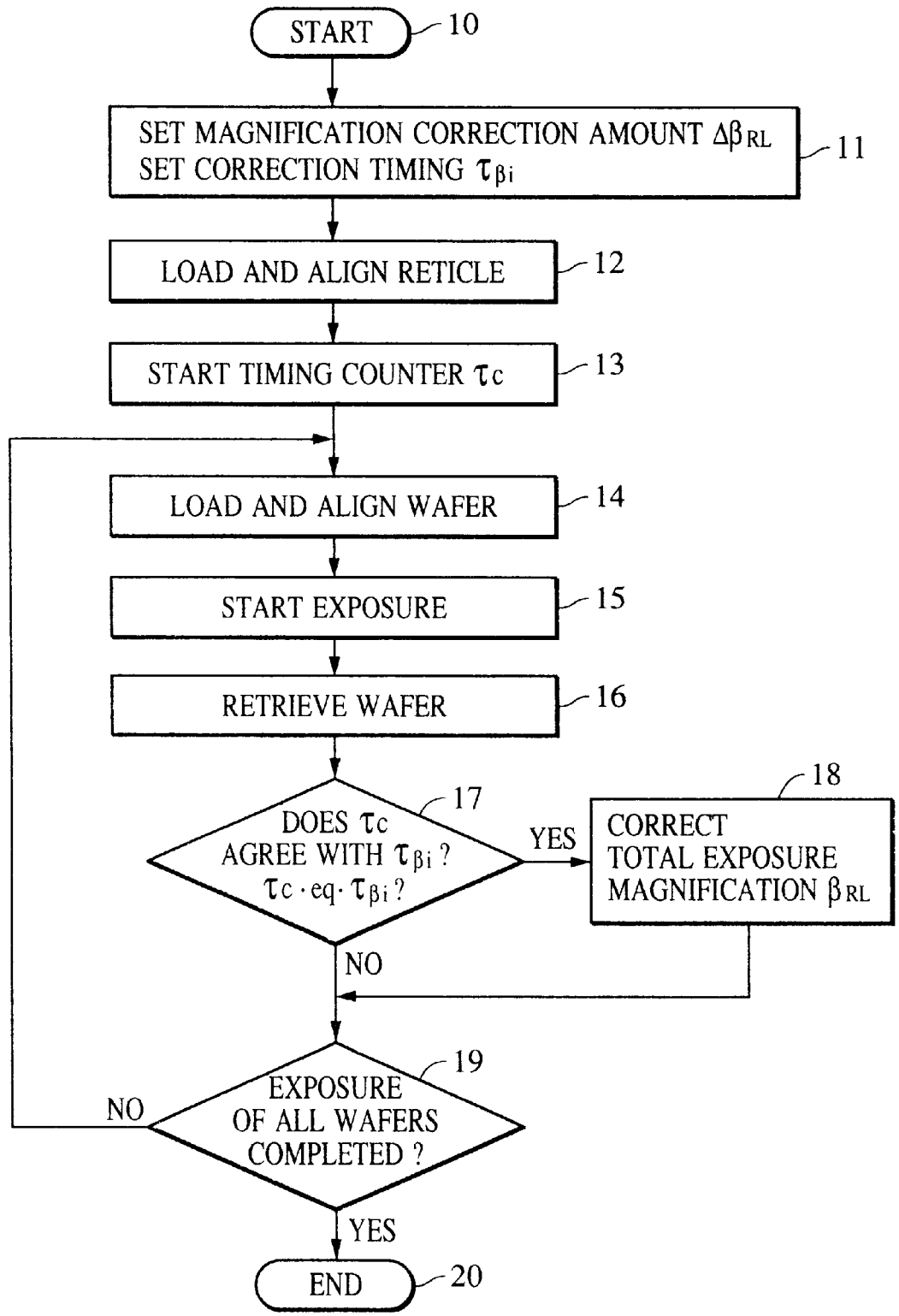
FIG. 1 is a flowchart showing a main exposure sequence in accordance with a first embodiment of the present invention.

When the exposure sequence is started in step 10 shown in FIG. 1, a subroutine for setting the magnification correction amount $\Delta\beta_{RL}$ and the correction timing $\tau\beta_i$ (shown in step 80 in FIG. 2) is initiated in step 11.

Figure 2:
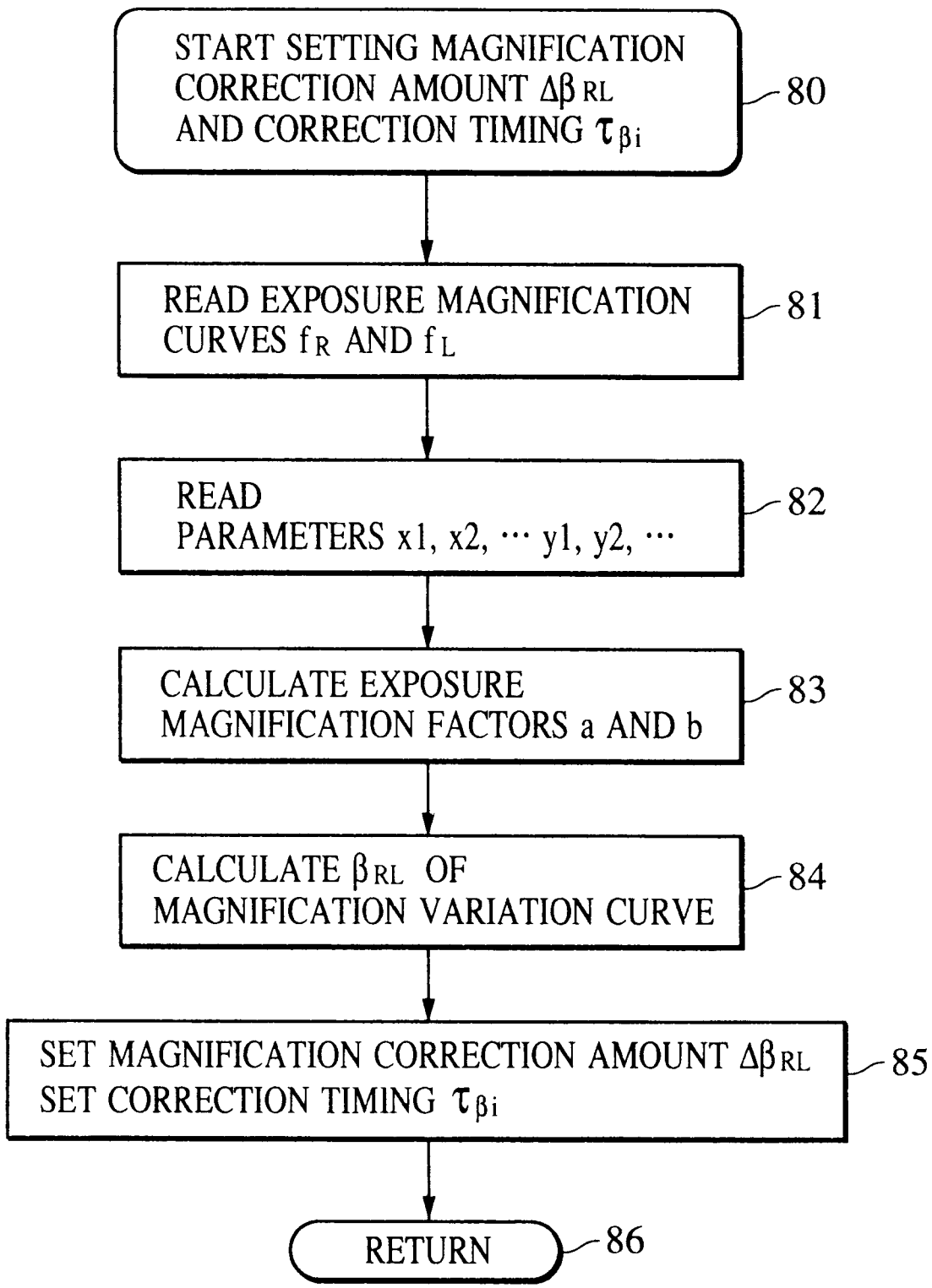
FIG. 2 is a flowchart showing a sub-sequence for setting the magnification correction amount and the correction timing in the exposure sequence of FIG. 1.

As soon as the setting of the magnification correction amount $\Delta\beta_{RL}$ and the correction timing $\tau\beta_i$ is begun by the subroutine in step 80 shown in FIG. 2, the reference reticle magnification curve $f_R$, the reference lens magnification curve $f_L$, the reference energy $Q_{RC}$ absorbed by the reticle and the reference energy $Q_{LC}$ launched into the lens, which have been determined beforehand by implementing experiments and simulations and stored in the console 43 as previously mentioned, are read out from a memory into a main memory, in step 81. Then, specific parameters x1, x2, and so on and y1, y2, and so on, such as the reticle surface illuminance and the Cr pattern existence ratio peculiar to a process to be implemented are read into the main memory in step 82. In step 83, based on the parameters which have been thus read in, energy $Q_R$ absorbed by the reticle and energy $Q_L$ launched into the lens are computed as mentioned above by an arithmetic unit and the result is divided by $Q_{RC}$ and $Q_{LC}$ which have already been read in, so as to calculate the exposure magnification coefficients a and b for this process. In step 84, using the curves $f_R$, $f_L$ which have been read in step 81 and the coefficients a, b obtained in step 83, the integrated exposure magnification variation curve $\beta_{RL}$ for the entire system can be drawn, as shown in FIG. 8. Then, the program moves on to step 85, wherein the correction timing $\tau\beta_i$ is set.

In step 85, the magnification correction amount $\Delta\beta_{RL}$ required for one correction is first determined from the minimum linewidth, alignment accuracy, etc., required in this exposure process.

Figure 9:
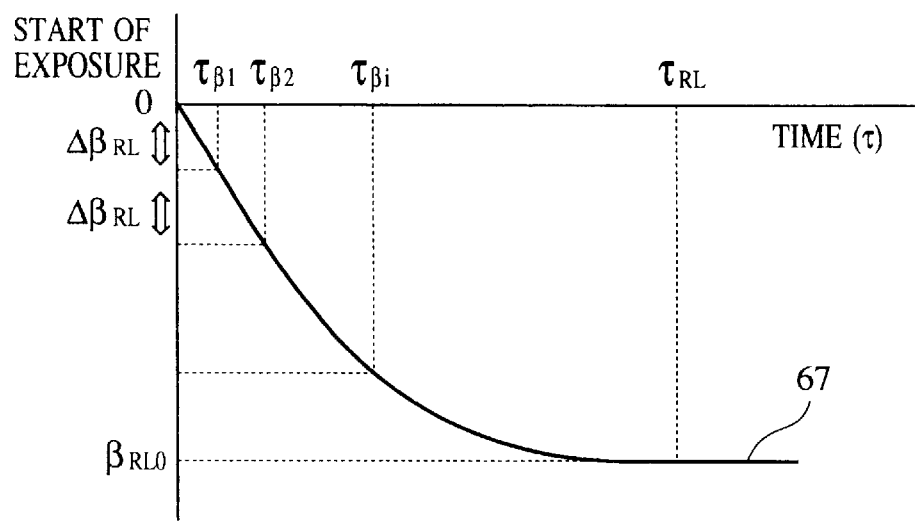
FIG. 9 is an enlarged view of an unsteady portion of the magnification shown in FIG. 8.

FIG. 9 shows an enlarged view of the period in which the integrated exposure magnification $\beta_{RL}$ of FIG. 8 reaches the steady state. Based on a profile 67 of $\beta_{RL}$ and the value of $\Delta\beta_{RL}$ shown in FIG. 9, the correction timing $\tau\beta_i$ before reaching the steady state is determined. Naturally, even when the exposure magnification curve $\beta_{RL}$ remains unchanged, $\Delta\beta_{RL}$ changes if the linewidth and/or the alignment accuracy changes; at the same time, the correction timing $\tau\beta_i$ also changes. Further, the curve of the profile 67 immediately after the exposure is started is different from that immediately before reaching the steady state; therefore, the correction timing interval also changes. Upon completion of the setting step, the subroutine is terminated, and the program goes back to the main sequence, in step 86.

In the main sequence, in step 12, the reticle 30 is loaded on the reticle stage and aligned at a predetermined position. Then, a timing counter $\tau_C$ for counting the magnification correction is started in step 13, prior to the exposure of the first wafer. Then, the first wafer 38 is loaded on the wafer stage 40 and aligned in step 14, and the exposure is begun in step 15. Upon completion of the exposure, the first wafer 38 is retrieved in step 16, and the program proceeds to step 17. At this stage, the timing counter $\tau_C$ has not yet reached the exposure magnification correction timing $\tau\beta_i$ so that the program directly proceeds to step 19. If it is decided in step 19 that the exposure of all wafers has not yet been completed, then the program goes back to step 14, wherein the second (or next) wafer is loaded on the wafer stage and aligned, and then the exposure is begun again. As this series of steps is repeated, the reticle 30 and the projection lens assembly 36 gradually absorb the exposure light, causing a change in the magnification.

In step 17, when the timing counter $\tau_C$ reaches the correction timing $\tau\beta_i$ after a certain number of wafers 38 has been processed, the program proceeds to the sequence for making a magnification correction, in step 18. In step 18, for making the magnification correction, a known magnification correcting method is utilized, in which the driving means 35 shown in FIG. 3 moves a particular lens element, which is capable of controlling the projection magnification among the lens elements of the projection lens assembly 36, in the direction of the optical axis of the projection lens assembly 36. The lens moving target value is the lens driving amount corresponding to the exposure magnification correction amount $\Delta\beta_{RL}$ which has been set in step 11.

Upon completion of the magnification correction, the program goes back to the main sequence to resume the exposure. After that, the exposure is repeated, and each time the timing counter $\tau_C$ agrees with the correction timing $\tau\beta_i$, the program is shifted to the magnification correction sequence in step 18, thus repeating the correction. When the exposure magnification reaches a steady state, no more correction is made, and the exposure is repeated with the corrected magnification maintained. As soon as all the wafers have been processed, the main exposure sequence is terminated in step 20.

A second embodiment of the present invention will now be explained.

The second embodiment is characteristic in that it is provided with a function that enables the magnification correction timing to be set on a shot-to-shot basis. To explain this embodiment, an example will be taken wherein the magnification of the projection lens assembly 36 changes in the positive direction; more specifically, the projection lens assembly 36 has a characteristic wherein the projection image of the circuit pattern of the reticle 30 is enlarged on the exposure image surface as the exposure is repeated.

Figure 10:
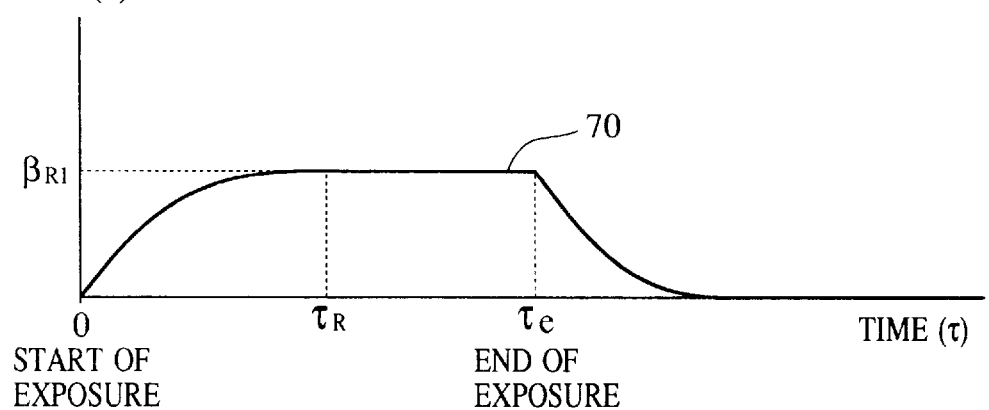
FIG. 10 is a graph showing the curve of the reticle exposure magnification in accordance with a second embodiment.
Figure 11:
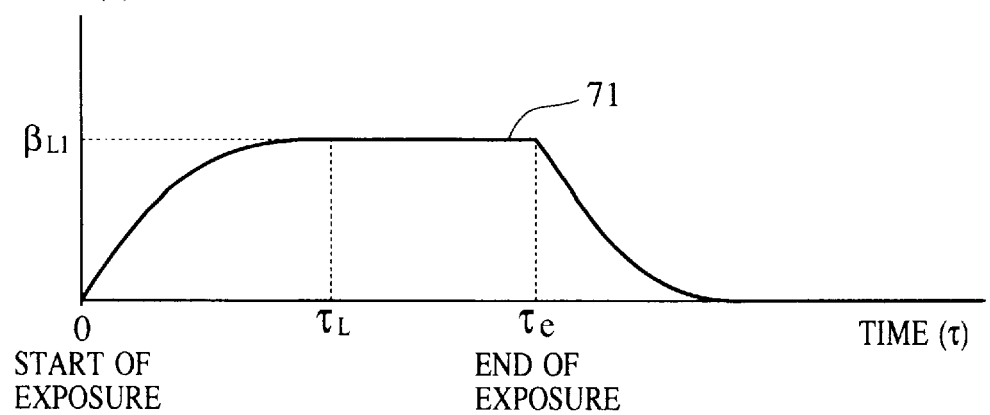
FIG. 11 is a graph showing the curve of the lens exposure magnification in accordance with the second embodiment.

As in the case of the first embodiment, the magnification variation reference curves $f_R$ and $f_L$ of the reticle factor and the projection lens factor, respectively, are determined under a reference exposure condition, in advance, by carrying out experiments and simulations, and stored in the console 43. Then, the reticle exposure coefficient a and the lens exposure coefficient b are determined from an actual exposure condition so as to estimate magnification changes $\beta_R$ and $\beta_L$ for each factor. These estimated changes are shown in FIG. 10 and FIG. 11.

Figure 12:
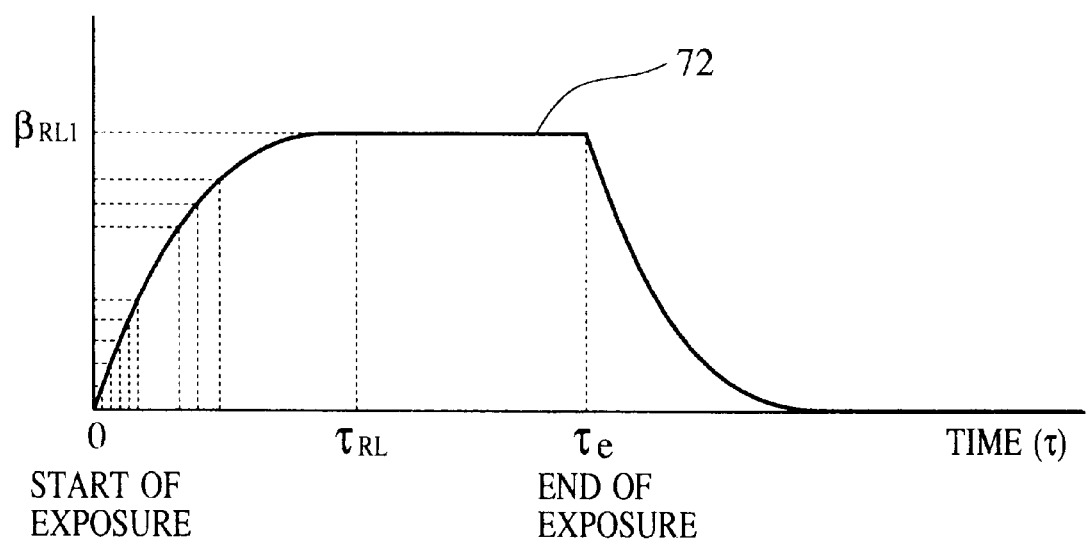
FIG. 12 is a graph showing the curve of the integrated exposure magnification in accordance with the second embodiment.

In the first embodiment, the reticle exposure magnification $\beta_R$ and the lens exposure magnification $\beta_L$ vary in the positive and negative directions, respectively; therefore, the combined exposure magnification $\beta_{RL}$ is a result of the two factors canceling each other, leading to a relatively small change in the magnification. This is why fewer corrections of the magnification have been made. The case of the projection lens assembly 36 in the second embodiment, however, is characterized in that the magnification variation curve $\beta_L$ moves in the positive direction; therefore, the combined exposure magnification $\beta_{RL}$ equals the sum of the two factors, resulting in a larger change in the magnification, as shown in FIG. 12. In such a case, the magnification must be corrected more frequently, until the integrated exposure magnification $\beta_{RL}$ reaches the steady state. In particular, if the mainstream wafer size is increased from 8 inches to 12 inches in the future, then the number of shots per wafer is likely to be increased. Inevitably, the tolerance of the linewidth and the alignment accuracy error will be more strict. From this standpoint, the wafer-to-wafer correction timing will no longer be adequate; therefore, the shot-to-shot correction timing will be necessary.

Figure 13:
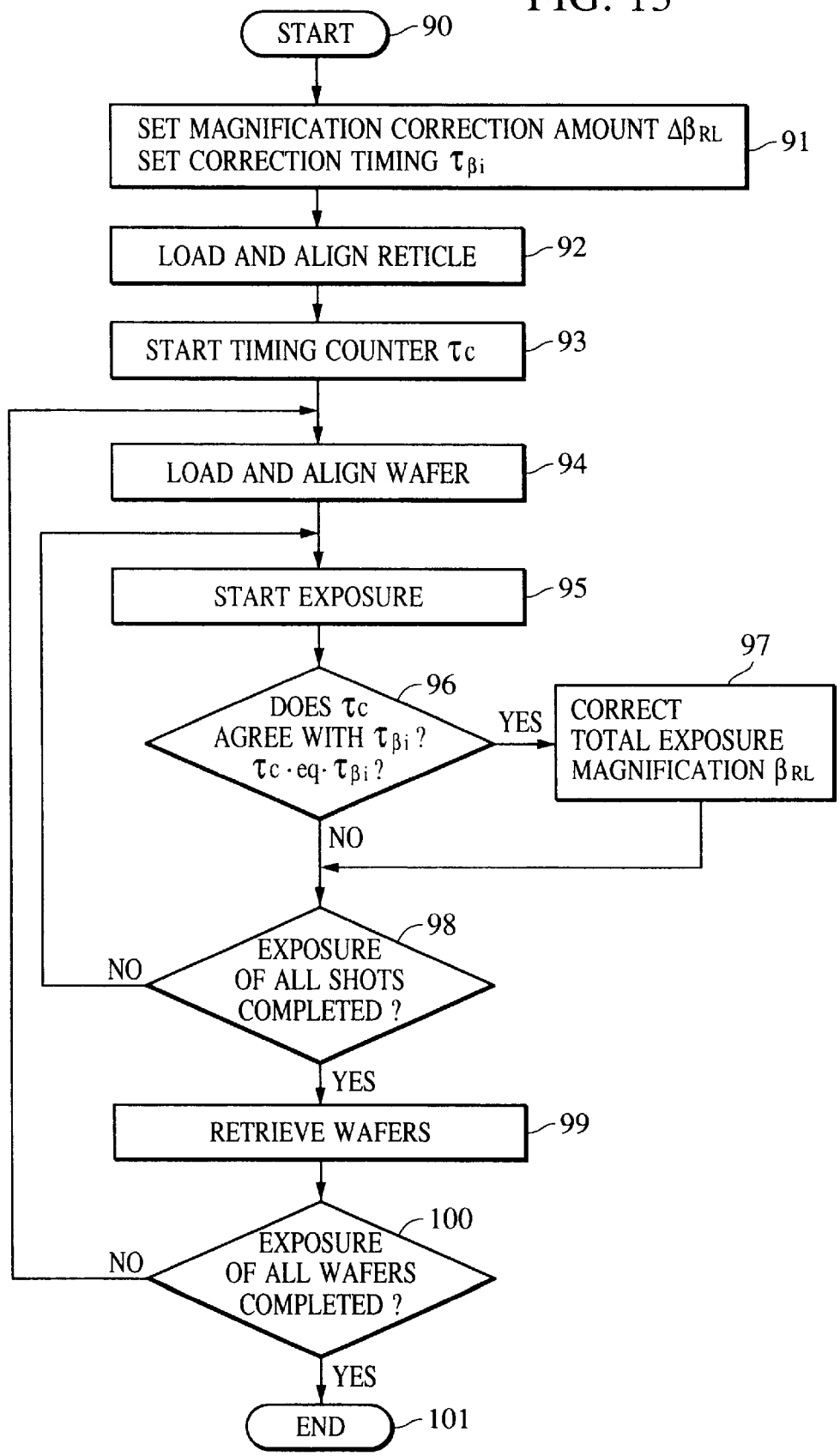
FIG. 13 is a flowchart showing a main exposure sequence in accordance with the second embodiment.

Accordingly, in the second embodiment, a sequence will be discussed wherein the correction timing is set on a shot-to-shot basis, as illustrated in FIG. 13. In the flowchart of FIG. 13, steps 90 through 94 are exactly the same as the corresponding steps in the sequence in the first embodiment. Therefore, discussion of those steps will not be repeated herein.

In FIG. 13, the exposure is started in step 95. In the sequence of this embodiment, each time one shot of exposure is completed, it is determined in step 96 whether the value of the timing counter $\tau_C$ has reached the correction timing $\tau\beta_i$ which has been set in step 91. Immediately after the exposure is begun, $\tau_C \neq \tau\beta_i$, so that the program advances to step 98, then back to step 95 where it performs the following shot of exposure. This series of steps is repeated, and when the exposure of one wafer is completed, the wafer is retrieved in step 99.

If it is determined in step 100 that the exposure of all the wafers has not yet been completed, then the program returns to step 94, wherein the next wafer is loaded on the wafer stage and aligned, and the exposure is restarted in step 95. As these steps are repeated, the integrated exposure magnification gradually varies. If it is determined that the value on the timing counter u has reached the correction timing $\tau\beta_i$ upon the completion of the jth shot exposure of the ith wafer, then the program proceeds to step 97 to correct the integrated exposure magnification $\beta_{RL}$. As in the first embodiment, in this step 97, the known magnification correcting means 35 makes the correction according to the magnification correction amount $\Delta\beta_{RL}$ which has been set in step 91. Upon completion of the correction, the program returns to the main sequence to resume the exposure, starting with the jth+1 shot of the ith wafer. Thus, the magnification is corrected according to the correction timing lip until the magnification variation $\beta_{RL}$ reaches the steady state. Once the steady state is reached, the correction value is maintained. The exposure is repeated, and when all the wafers have been processed, i.e., if the determination result in step 100 is affirmative, then the main sequence is terminated, in step 101.

Thus, the function for enabling the integrated exposure magnification $\beta_{RL}$ to be corrected on a shot-to-shot basis makes it possible to design a system which is capable of successfully coping with large magnification changes by allowing a correction to be made while a wafer is being processed, even when the magnification varies markedly.

A third embodiment will now be explained.

In the first and second embodiments, a description has been given of a procedure for correcting the exposure magnification change when the exposure is started with no exposure load applied to the reticle and the lens. In an actual process, however, the exposure is not always begun with an aligner in a thermally still state. Rather, there is a likelihood that the preceding process may affect the present process when the reticle has been replaced or for another reason. The third embodiment will embody the present invention applied to a case wherein the reticle is replaced in the middle of an exposure process, and the exposure history of the preceding process is taken into account.

Figure 14:
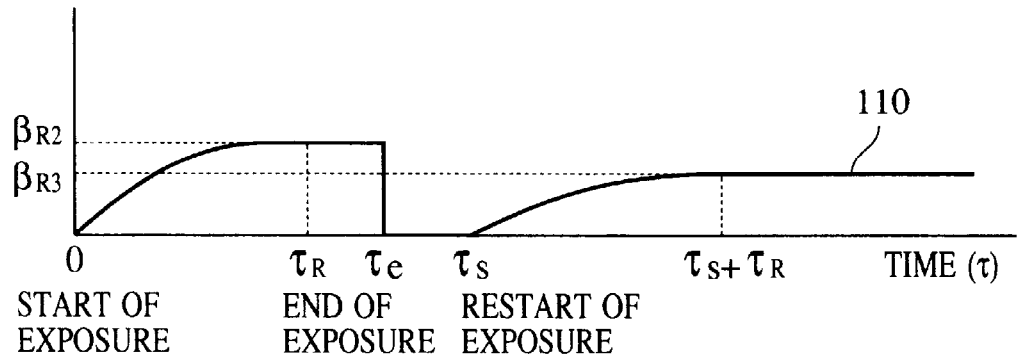
FIG. 14 is a graph showing the curve of the reticle exposure magnification in accordance with a third embodiment.
Figure 15:
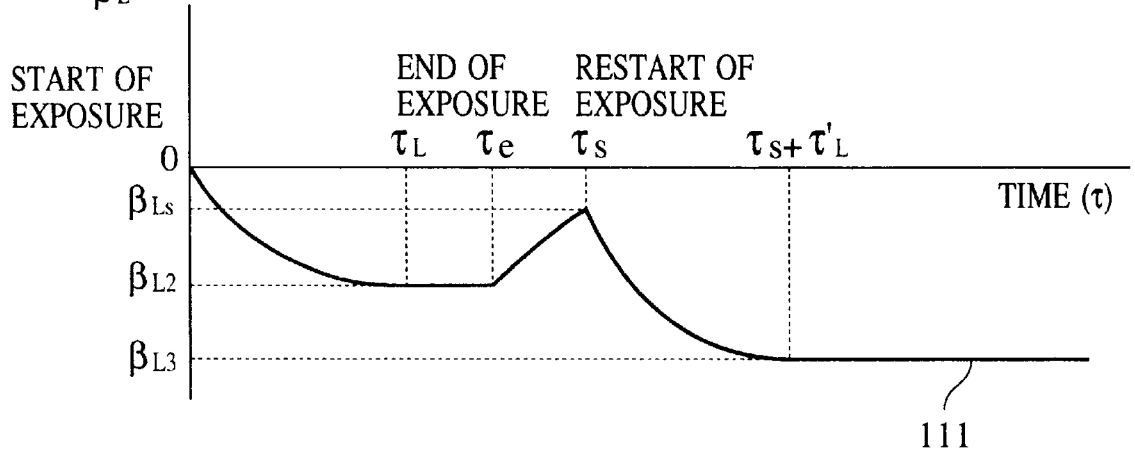
FIG. 15 is a graph showing the curve of the lens exposure magnification in accordance with the third embodiment.
Figure 16:
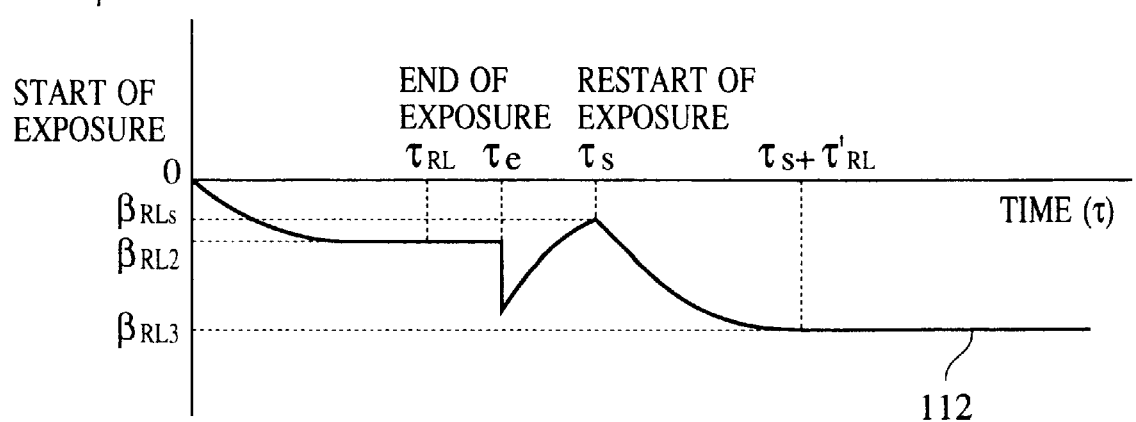
FIG. 16 is a graph showing the curve of the integrated exposure magnification in accordance with the third embodiment.

FIGS. 14, 15, and 16 show the predicted magnification changes when the reticle is replaced during the process. Reference numerals 110, 111, and 112 in these charts respectively denote the reticle exposure magnification, the lens exposure magnification, and the combined exposure magnification profile. As in the first embodiment, the third embodiment will also utilize an example wherein the projection lens assembly reduces the projection image from a predetermined projection image as the exposure is repeated.

First, when the exposure is started on the first reticle at time $\tau=0$, the reticle exposure magnification $\beta_R$ and the lens exposure magnification $\beta_L$ will reach the steady state at $\tau=\tau_R$ and $\tau=\tau_L$, respectively, and the magnifications will be $\beta_{R2}$ and $\beta_{L2}$, respectively. Hence, the combined exposure magnification will reach the steady state at $\tau_{RL}$, and the magnification will be $\beta_{RL2}$. When the exposure is stopped at $\tau=\Sigma_e$ and the first reticle is removed, the reticle exposure magnification $\beta_R$ becomes 0, and the lens exposure magnification $\beta_L$ gradually approaches zero as the lens cools down. Meanwhile, the second reticle is carried onto the reticle stage and aligned. As the exposure is restarted at $\tau=\tau_S$, the magnifications gradually vary again. It should be noted that, regarding the lens exposure magnification $\beta_L$, if the time from the end of the exposure to the restart of the exposure is shorter than the time constant $\tau_L$ of the lens exposure magnification $\beta_L$, then the lens exposure magnification $\beta_L$ at the time of the restart of the exposure is influenced by the exposure history of the previous process. More specifically, since the lens exposure magnification is already present when the exposure is restarted, the magnification correcting intervals are different from those in the first and second embodiments, or the time required to reach the steady state is shorter. Hence, the lens exposure magnification $\beta_L$ predicted in the previous process and a time interval $(\tau_S-\tau_e)$ from the end of the exposure to the restart of the exposure are used to calculate the lens exposure magnification $\beta_{LS}$ at the restart. The combined exposure magnification $\beta_{RLS}$ at the restart of the exposure is equal to the lens exposure magnification $\beta_{LS}$. When the exposure is started at the magnification of $\beta_R=0$ and $\beta_L=\beta_{LS}$ at $\tau=\tau_S$, the reticle exposure magnification and the lens exposure magnification reach the steady state at $\tau=\tau_S+\tau_R$ and $\tau_S+\tau'_L$, respectively, the magnifications being $\beta_{R3}$ and $\beta_{L3}$. The combined exposure magnification reaches the steady state at $\tau_S+\tau'_{RL}$, the magnification being $\beta_{RL3}$. Thus, when the reticle is replaced during a process, the calculation of the lens exposure magnification at the restart of the exposure is important.

Figure 17:
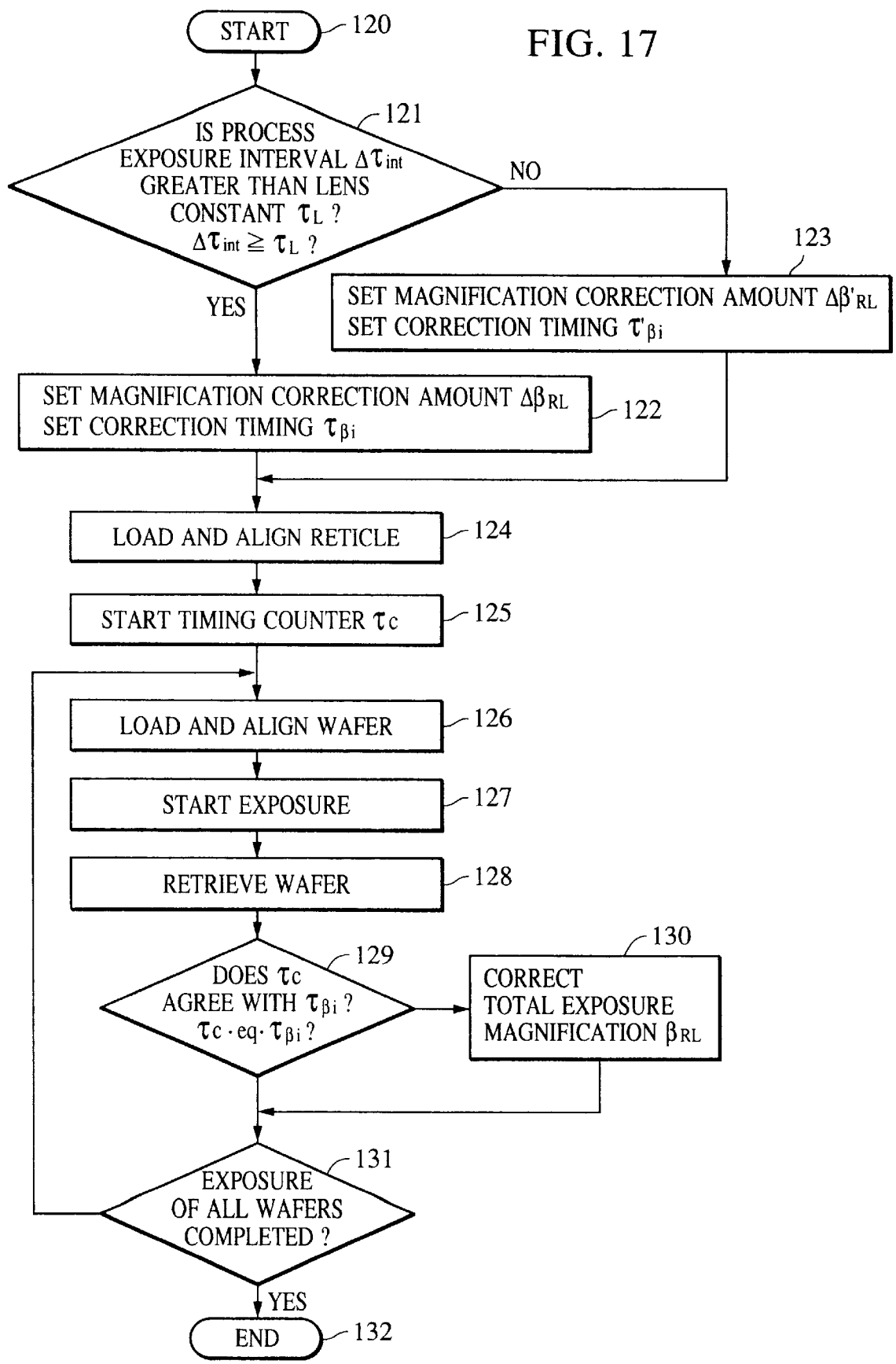
FIG. 17 is a flowchart showing a main exposure sequence in accordance with the third embodiment.

The exposure sequence of the third embodiment will now be described with reference to FIG. 17.

First, the exposure sequence is begun in step 120. Then, the time interval from the moment the preceding process was completed to the current time, i.e., a process exposure interval $\Delta\tau_{int}$ is determined in step 121, and if the determined value is sufficiently larger than the time constant $\tau_L$ of the lens exposure magnification $\beta_L$ used in the preceding process, then it means that the projection lens 35 has reached a thermal equilibrium condition and the lens exposure magnification $\beta_L$ has not yet occurred. Hence, the sequence for setting the parameters in step 122 is exactly the same as that of the first or second embodiment (see FIG. 2). Specifically, the reticle exposure coefficient a and the lens exposure coefficient b are determined according to the exposure condition required by the new process so as to predict the magnification changes $\beta_R$ and $\beta_L$ of the respective factors and the integrated exposure magnification $\beta_{RL}$. Then, the magnification correction amount $\Delta\beta_{RL}$ required for one correction is determined mainly from the minimum linewidth and the alignment accuracy required for the exposure process in order to determine the correction timing $\tau_{\beta i}$. Next, by using these two determined values, namely, $\beta_{RL}$ and $\tau_{\beta i}$, the magnification variation is corrected by the magnification correcting function 35 of the projection lens assembly 36 according to the steps 124 through 131 until the integrated exposure magnification reaches the steady state. These steps 124 through 131 are identical to steps 12 through 19 of the first embodiment.

Conversely, in step 121, if the process exposure interval $\Delta\tau_{int}$ is shorter than the time constant $\tau_L$ of the lens exposure magnification $\beta_L$ used in the preceding process, then it means that the temperature of the projection lens assembly 36 has not yet lowered sufficiently, and the lens exposure magnification $\beta_L$ still retains the influences of the preceding process, requiring a different method from that of the first and second embodiments to predict the integrated exposure magnification. Accordingly, in step 123, the lens exposure magnification $\beta_{LS}$ at the current moment is calculated from the profile $\beta_L$ predicted in the preceding process and the process exposure interval $\Delta\tau_{int}$. In the next step, the reticle exposure coefficient a is determined according to the exposure condition required in the new process to predict the reticle exposure magnification $\beta_R$. For the lens, the lens exposure coefficient b is determined, and the lens exposure magnification $\beta_L$ is predicted by using the calculated value of $\beta_{LS}$. Based on these exposure magnification profiles, the integrated exposure $\beta_{RL}$ is predicted. Then, the magnification correction amount $\Delta\beta'_{RL}$ required for one correction is determined mainly from the minimum linewidth and the alignment accuracy required for the exposure process in order to determine the correction timing $\tau'_{\beta i}$.

After completion of the setting procedure in step 123, the variation in the magnification is corrected by the magnification correcting function 35 of the projection lens assembly 36 according to the steps 124 through 131 until the integrated exposure magnification reaches the steady state. The magnification correction is made according to the correction timing $\tau_{\beta i}$ until the magnification variation $\beta_{RL}$ reaches the steady state; after the steady state is reached, the correction value is maintained. The exposure is repeated and when all the wafers have been processed, i.e., if the determination result in step 131 is affirmative, the main sequence is terminated in step 132.

Thus, the third embodiment is equipped with a function for discriminating, prior to exposure, a case wherein the exposure is restarted after a sufficient time has passed since the end of a preceding process from a case wherein an insufficient time has passed and the influences of the exposure history of the preceding process are still retained. This makes it possible to precisely correct the exposure magnification even when the reticle is replaced frequently and the following process is affected by the preceding process, which case is different from a case wherein the exposure is started while the projection aligner is in a thermally steady state condition.

As explained in detailed above, according to the present invention, there is provided a means for dividing the factors that change the magnification caused by exposure light into the reticle factor and the projection lens factor, and determining the magnification variation curves of these factors from operating parameters so as to predict an actual combined change in the magnification. This makes it possible to determine proper timings for correcting the integrated magnification of the projection aligner system, enabling detailed corrections of magnification and distortion to be made to successfully adjust to a variety of processes. Hence, the use of the present invention permits highly accurate overlapping to be achieved easily and also permits easy mixing and matching between different types of steppers. Moreover, the present invention can be implemented very easily because it merely requires an improved and added sequence.

Except as otherwise disclosed herein, the various components shown in online or in block form in the Figures are individually well known and their internal construction and operation are not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A projection aligner which projects light onto a circuit pattern on a reticle and which aligns and projects the circuit pattern onto a substrate via a projection lens assembly, said projection aligner comprising:

means for generating a reticle reference data curve indicating a relationship between exposure time of the reticle and a variation in an exposure magnification of the reticle, which curve is obtained when exposure is performed under a reference exposure condition established using a parameter governing the exposure magnification of the reticle;

means for generating a projection lens reference data curve indicating a relationship between exposure time of the projection lens assembly and a variation in the exposure magnification of the lens assembly, which curve is obtained when exposure is performed under a reference exposure condition established using a parameter governing the exposure magnification of the projection lens assembly;

storing means for storing information related to the reticle reference data curve and for storing information related to the projection lens assembly data curve; and magnification correcting means for correcting exposure magnification on the basis of a linear sum of the information stored in said storing means.

2. A projection aligner according to claim 1, further comprising combining means for combining the information related to the reticle reference data curve and the information related to the projection lens assembly data curve to obtain combined information corresponding to a combined data curve indicating a variation in overall exposure magnification with respect to the exposure time, the curve being based on the parameter governing the exposure magnification of the reticle and the parameter governing the exposure magnification of the projection lens assembly, at actual exposure.

3. A projection aligner according to claim 2, wherein said magnification correcting means corrects the overall exposure magnification on the basis of the combined information in said combining means.

4. A projection aligner according to claim 2, wherein said magnification correcting means corrects the overall exposure magnification by determining a correction amount of the exposure magnification and a correction timing on the basis of the combined data curve, showing the variation in the overall exposure magnification with respect to the exposure time, and on the basis of a predetermined tolerance in the variation in the exposure magnification, which can be determined from an overlapping accuracy and a minimum linewidth for the circuit pattern on the reticle.

5. A projection aligner according to claim 4, wherein said magnification correcting means corrects an optical peculiarity of the projection lens assembly according to the correction amount of the magnification at the correction timing.

6. A projection aligner according to claim 1, wherein said magnification correcting means corrects the exposure magnification at a timing for each substrate or for each projection shot.

7. A projection aligner according to claim 1, wherein, when the reticle has been replaced with a new one in performing projection alignment, if a process exposure interval, which is a time interval between the end of one exposure process of the reticle and the start of exposure of the new reticle is shorter than the exposure time required for a steady state to be reached in the reference data curve indicating a relationship between the projection lens assembly exposure time and the variation in the projection lens assembly exposure magnification, then said magnification correcting means obtains the projection lens assembly magnification at the start of the exposure of the new reticle from the data on that curve and from the process exposure interval, and by taking the obtained projection lens assembly magnification into account, said magnification correcting means obtains the data on that curve for the new reticle.

8. A projection aligner according to claim 7, wherein said magnification correcting means combines a data curve indicating a variation in the projection lens assembly exposure magnification with the exposure time and a data curve indicating a variation in the reticle exposure magnification with the exposure time of the new reticle, so as to obtain a new data curve indicating a variation in the overall exposure magnification with respect to the exposure time for the new reticle.

9. A projection aligning method for projecting light onto a circuit pattern on a reticle and for aligning and projecting the circuit pattern onto a substrate via a projection lens assembly, said projection aligning method comprising the steps of:

generating a reticle reference data curve indicating a relationship between exposure time of the reticle and a variation in an exposure magnification of the reticle, which curve is obtained when exposure is performed under a reference exposure condition established using a parameter governing the exposure magnification of the reticle;

generating a projection lens reference data curve indicating a relationship between exposure time of the projection lens assembly and a variation in the exposure magnification of the lens assembly, which curve is obtained when exposure is performed under a reference exposure condition established using a parameter governing the exposure magnification of the projection lens assembly;

storing information related to the reticle reference data curve and information related to the projection lens assembly data curve; and correcting the exposure magnification on the basis of a linear sum of the information stored in said storing step.

10. A projection aligning method according to claim 9, further comprising combining the information related to the reticle reference data curve and the information related to the projection lens assembly data curve to obtain combined information corresponding to a combined data curve indicating a variation in overall exposure magnification with respect to the exposure time, the curve being based on the parameter governing the exposure magnification of the reticle and the parameter governing the exposure magnification of the projection lens assembly, at actual exposure.

11. A projection aligning method according to claim 10, wherein said correcting step corrects the overall exposure magnification on the basis of the combined information.

12. A projection aligning method according to claim 10, wherein said magnification correcting step corrects the overall exposure magnification by determining a correction amount of the exposure magnification and a correction timing on the basis of the combined data curve, showing the variation in the overall exposure magnification with respect to the exposure time, and on the basis of a predetermined tolerance in the variation in the exposure magnification, which can be determined from an overlapping accuracy and a minimum linewidth for the circuit pattern on the reticle.

13. A projection aligning method according to claim 12, wherein said magnification correcting step corrects an optical peculiarity of the projection lens assembly according to the correction amount of the magnification at the correction timing.

14. A projection aligning method according to claim 9, wherein said magnification correcting step corrects the exposure magnification at a timing for each substrate or for each projection shot.

15. A projection aligning method according to claim 9, wherein, when the reticle has been replaced with a new one in performing projection alignment, if a process exposure interval, which is a time interval between the end of one exposure process of the reticle and the start of exposure of the new reticle is shorter than the exposure time required for a steady state to be reached in the reference data curve indicating a relationship between the projection lens assembly exposure time and the variation in the projection lens assembly exposure magnification, then said magnification correcting step obtains the projection lens magnification at the start of the exposure of the new reticle from the data on that curve and from the process exposure interval, and by taking the obtained projection lens assembly magnification into account, said magnification correcting step obtaining the data on that curve for the new reticle.

16. A projection aligning method according to claim 15, wherein said correcting step combines a data curve indicating a variation in the projection lens assembly exposure magnification with the exposure time and a data curve indicating a variation in the reticle exposure magnification with the exposure time of the new reticle so as to obtain a new data curve indicating a variation in the overall exposure magnification with respect to the exposure time for the new reticle.

* * * * *

UNITED STATES PATENT AND TRADEMARK OFFICE
CERTIFICATE OF CORRECTION

PATENT NO. : 6,088,082

DATED : July 11, 2000

INVENTOR(S) : MASAMI YONEKAWA

It is certified that error appears in the above-identified patent and that said Letters Patent is hereby corrected as shown below:

COLUMN 4:
 Line 22, "$\mu_{RL}$" should read --$\beta_{RL}$--.
 Line 16, "terr" should read --terr.--.

COLUMN 6:
 Line 29, "PR" should read --$\beta_R$--.

COLUMN 7:
 Line 5, "a" should read --$\alpha$--.

COLUMN 9:
 Line 15, "$Q_{LC}$y1c·y2c·y3c·y4c." should read --$Q_{LC}$ = y1c · y2c · y3c · y4c.--.
 Line 21, "$\beta_L$=b·$f_L$($\tau$)" should read --$\beta_L$ = b · $f_L$ ($\tau$).--.
 Line 34, "+b·$f_L$($\tau$)" should read --+ b · $f_L$ ($\tau$).--.

UNITED STATES PATENT AND TRADEMARK OFFICE
CERTIFICATE OF CORRECTION

PATENT NO. : 6,088,082
DATED : July 11, 2000
INVENTOR(S) : MASAMI YONEKAWA

It is certified that error appears in the above-identified patent and that said Letters Patent is hereby corrected as shown below:

COLUMN 11:
   Line 63, "timing counter u" should read --timing counter $\tau_c$--.

COLUMN 12:
   Line 6, "lip" should read --$\tau\beta_i$--.
   Line 47, "$\tau=\Sigma_e$" should read --$\tau = \tau_e$--.

COLUMN 14:
   Line 21, "detailed" should read --detail--.
   Line 44, "is" should read --are--.

Signed and Sealed this

Fifteenth Day of May, 2001

Attest:

NICHOLAS P. GODICI

Attesting Officer       Acting Director of the United States Patent and Trademark Office